United States Patent
Namba et al.

(10) Patent No.: US 11,143,956 B2
(45) Date of Patent: Oct. 12, 2021

(54) EJECTION DEVICE AND IMPRINT APPARATUS

(71) Applicant: CANON KABUSHIKI KAISHA, Tokyo (JP)

(72) Inventors: Hisashi Namba, Utsunomiya (JP); Noriyasu Hasegawa, Utsunomiya (JP); Ken Katsuta, Saitama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 165 days.

(21) Appl. No.: 16/234,952

(22) Filed: Dec. 28, 2018

(65) Prior Publication Data
US 2019/0219918 A1    Jul. 18, 2019

(30) Foreign Application Priority Data
Jan. 12, 2018    (JP) .............................. JP2018-003497

(51) Int. Cl.
*G03F 7/00* (2006.01)
*H01L 21/027* (2006.01)
*B29C 59/00* (2006.01)
*B29C 59/02* (2006.01)

(52) U.S. Cl.
CPC .......... *G03F 7/0002* (2013.01); *B29C 59/002* (2013.01); *B29C 59/026* (2013.01); *H01L 21/0271* (2013.01)

(58) Field of Classification Search
CPC ............................ B29C 59/002; B29C 59/026
USPC ........................................................ 425/162
See application file for complete search history.

(56) References Cited

U.S. PATENT DOCUMENTS 5,341,162 A * 8/1994 Hermanson .............. B41J 2/175
  347/89
2015/0097900 A1* 4/2015 Araki ....................... B41J 2/175
  347/85
2016/0288378 A1* 10/2016 Arai ..................... B29C 35/0805

FOREIGN PATENT DOCUMENTS

JP    2006-095878 A    4/2016

* cited by examiner

*Primary Examiner* — Nahida Sultana
*Assistant Examiner* — Asha A Thomas
(74) *Attorney, Agent, or Firm* — Venable LLP (57) ABSTRACT

Provided is an ejection device and an imprint apparatus which can suppress ejection failures and breakage of a mold. To achieve this, a circulation mechanism including a degassing unit is provided in an ejection head.

9 Claims, 6 Drawing Sheets

EJECTION DEVICE AND IMPRINT APPARATUS

BACKGROUND OF THE INVENTION

Field of the Invention

The present invention relates to an ejection device and an imprint apparatus which eject an imprint material.

Description of the Related Art

Assume a case where a semiconductor device is to be fabricated by using an imprint apparatus. In this case, since a pattern of a mold is fine, when an ejection failure occurs in an ejection device configured to eject an imprint material, thickness of the imprint material becomes uneven and filling for the mold decreases. Thus, a favorable pattern cannot be sometimes formed. Hence, it is necessary to perform ejection in a favorable manner in the ejection device.

Entrapment of air bubbles in a pressure chamber communicating with ejection ports of an ejection head configured to eject the imprint material can be given as one of causes for the ejection failure. When air bubbles are entrapped in the imprint material in the pressure chamber, the air bubbles function as air dampers and prevent ejection of the imprint material from the ejection ports and the ejection failure occurs.

As a measure against generation of air bubbles in the pressure chamber, Japanese Patent Laid-Open No. 2006-095878 discloses a method in which a degassing unit is arranged near an ejection head and an imprint material is circulated to reduce the amount of dissolved gas in the entire ejection head.

SUMMARY OF THE INVENTION

An ejection device of the present invention is an ejection device comprising: ejecting unit for ejecting an imprint material to which a pattern of a mold is transferred by bringing the mold into contact with the imprint material; and containing unit including a first space containing the imprint material and a second space separated from the first space by a flexible member, the first space communicating with the ejecting unit, wherein the containing unit includes: a first opening which communicates with the first space; a second opening which communicates with the first space; connecting unit for allowing the imprint material to move between the first opening and the second opening; pump unit, provided in the connecting unit, for moving the imprint material between the first opening and the second opening; and degassing unit, provided in the connecting unit, for collecting gas dissolved in the imprint material.

Further features of the present invention will become apparent from the following description of exemplary embodiments with reference to the attached drawings.

DESCRIPTION OF THE EMBODIMENTS

However, in the method of Japanese Patent Laid-Open No. 2006-095878, a pipe of a circulation system needs to be connected every time a cartridge is replaced. When the pipe of the circulation system is connected, a coupling and the pipe are rubbed and particles are thereby generated. Mixing of foreign objects in the imprint material may cause breakage of the mold.

Accordingly, the present invention provides an ejection device and an imprint apparatus which can suppress ejection failures and breakage of a mold.

First Embodiment

A first embodiment of the present invention is described below with reference to the drawings.

Figure 1:
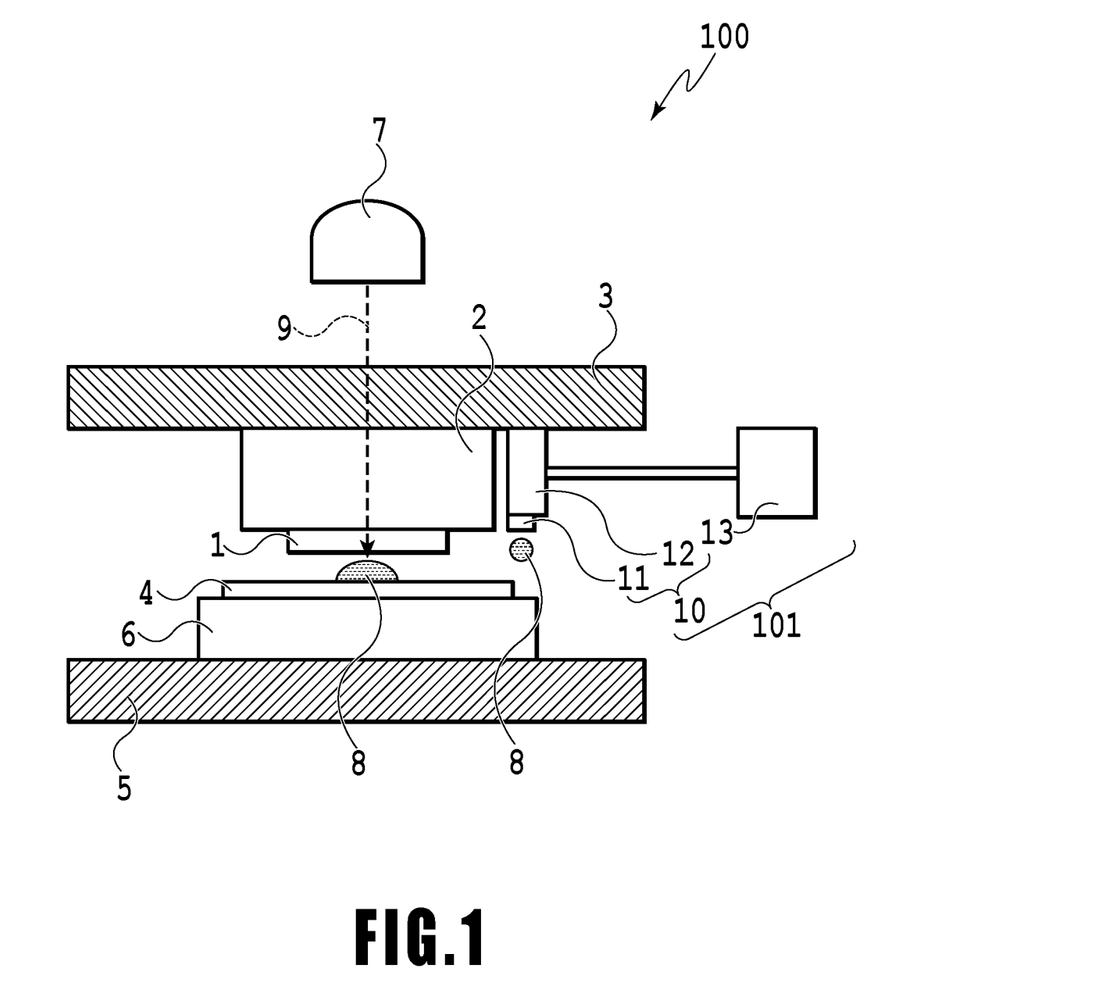
FIG. 1 is a view illustrating an imprint apparatus employing an ejection head.

FIG. 1 is a view illustrating an imprint apparatus 100 employing an ejection device 101 of the embodiment. The imprint apparatus 100 includes an ejection unit and an imprint unit. An imprint material 8 ejected from an ejection member 11 of the ejection unit (ejection device 101) is brought into contact with a mold in the imprint unit (processing device) and, in this state, is cured by being irradiated with an ultraviolet ray from an ultraviolet ray emitting device 7. Note that, in this embodiment, description is given of an example of a device which uses a UV curable resin as the imprint material 8 and which cures the UV curable resin by emitting the ultraviolet ray. However, the material and method of curing the imprint material 8 are not limited to those described above. For example, a light emitting device may emit a light with a wavelength other than ultraviolet to cure a light curable resin. Alternatively, a thermosetting resin may be used and be cured by being heated.

The ejection device 101 includes an ejection head 10 which is formed of the ejection member 11 and a containing member 12 and a pressure control member 13 which is capable of controlling a pressure inside the ejection head 10. A substrate 4 is installed on a stage 6 and the imprint material 8 is ejected from the ejection member 11 onto the substrate 4. The imprint material 8 ejected onto the substrate is cured by being irradiated with the ultraviolet ray from the ultraviolet ray emitting device 7 while being brought into contact with the mold 1. A fine recess and protrusion pattern and the like are formed on the mold 1. When the mold 1 is moved to a position above the ejected imprint material 8 and brought into contact therewith, the pattern of the mold 1 is transferred to the imprint material 8. As described above, the imprint material 8 is cured by using the ultraviolet ray with the pattern of the mold 1 transferred thereto.

The ejection head 10 is detachable and attachable. When all imprint material 8 in the ejection head 10 is consumed, the ejection head 10 is replaced by a new ejection head 10 and the new ejection head 10 ejects the imprint material 8 again as the ejection device 101.

The stage 6 can be moved on a base frame 5 while holding the substrate 4. A mold drive mechanism 2 which moves the mold 1 up and down is held on a structure 3 and can bring the mold 1 close to the substrate 4 and bring the mold 1 into contact with the imprint material 8. The ultraviolet ray emitting device 7 is provided above the mold 1 and emits the ultraviolet ray 9 to the imprint material 8 through the mold 1. A light source of the ultraviolet ray 9 may be a light source such as, for example, a halogen lamp which emits an I-line or G-line ray. Moreover, the ultraviolet ray emitting device 7 may have a function of focusing and shaping light generated by the light source.

Next, imprint operations are described. First, in the imprint operations, the substrate 4 is mounted on the stage 6. The substrate 4 is moved to a position below the ejection member 11 of the ejection head 10 by using the stage 6. Then, the imprint material 8 is ejected from the ejection member 11 onto the substrate 4 while the stage 6 is moved. Then, a portion of the substrate 4 where the imprint material 8 is ejected is moved to a position below the mold 1 by using the stage 6. Moreover, the mold 1 is lowered by the mold drive mechanism 2 and brought close to the substrate 4. In this state, the positions of the mold 1 and the substrate 4 relative to each other are adjusted by aligning an alignment mark on the mold 1 with an alignment mark on the substrate by using an alignment scope or the like. After the adjustment of the positions, the mold 1 is further lowered (toward the substrate 4) by the mold drive mechanism 2 and thereby brought into contact with the imprint material 8.

After the imprint material 8 and the mold 1 are brought into contact with each other, the ultraviolet ray 9 is emitted from the ultraviolet ray emitting device 7 and the imprint material 8 is irradiated with the ultraviolet ray 9 transmitted through the mold 1. A photocuring reaction of the imprint material 8 thereby occurs and the imprint material 8 is cured. Thereafter, the mold 1 is removed from the cured imprint material 8 by the mold drive mechanism 2. In the steps as described above, a pattern (patterned imprint material) is formed on the substrate 4.

In some cases, an imprint apparatus used for semiconductor manufacturing forms a pattern over an entire region of the substrate 4. However, in the embodiment, the imprint apparatus repeats the series of imprint operations while changing the region where the operations are performed on the substrate.

Figure 2:
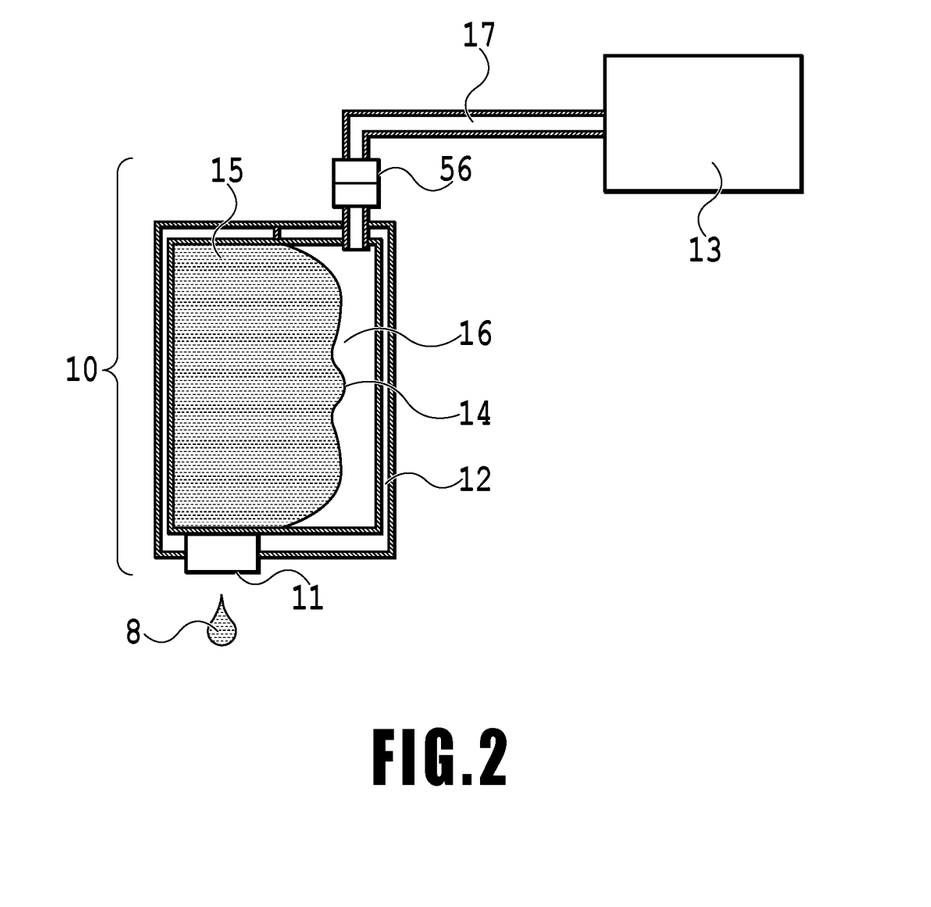
FIG. 2 is a view illustrating the ejection head and a pressure control member.

FIG. 2 is a view illustrating the ejection head 10 and the pressure control member 13. The ejection head 10 is described below. The ejection head 10 includes the ejection member 11 and the containing member 12 and is connected to the pressure control member 13 via a pipe 17 by using a coupling 56. The inside of the containing member 12 is divided into a containing portion 15 and a filling liquid portion 16 by a separation film 14 which is a flexible member. The thickness of the separation film 14 is preferably 10 µm or more and 200 µm or less. The separation film 14 is preferably made of a material with low gas and liquid permeability and is made of, for example, a multilayer aluminum film. Out of the spaces formed by the separation film 14, the containing portion 15 communicating with the ejection member 11 is filled with the imprint material 8.

Figure 3:
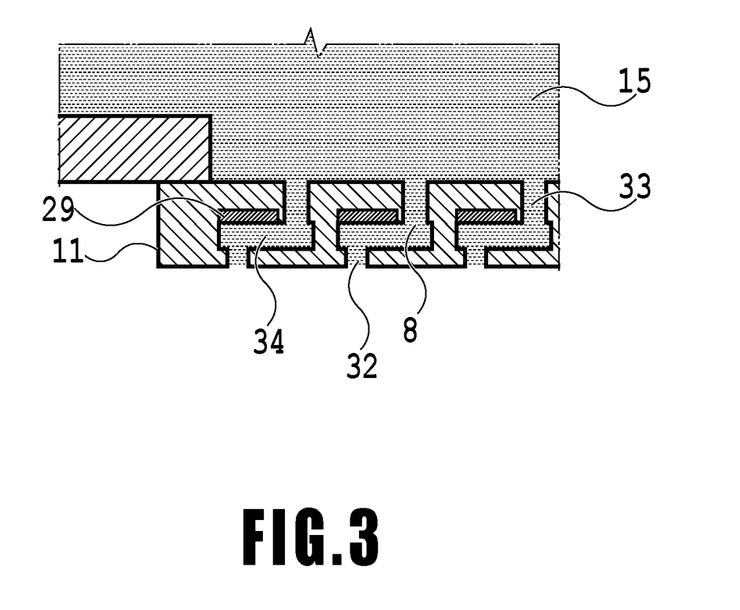
FIG. 3 is a cross-sectional view illustrating an inside of the ejection member in such a way that the viewer can see it.

FIG. 3 is a cross-sectional view illustrating the inside of the ejection member 11 in such a way that the viewer can see it. The ejection member 11 includes energy generation elements 29 which generate energy for ejecting the imprint material 8. Moreover, the ejection member 11 includes ejection ports 32 configured to eject the imprint material 8 and pressure chambers 34 communicating with the ejection ports 32. Piezoelectric elements can be given as an example of the energy generation elements 29. The energy generation elements 29 are controlled by a controller to generate pressure fluctuation in the pressure chambers 34 and thereby cause the imprint material 8 in the pressure chambers 34 to be ejected from the ejection ports 32 onto the substrate 4.

Non-ejection can be given as an example of an ejection failure in the ejection member 11 with such a structure. One of the causes for occurrence of the non-ejection is entrapping of air bubbles in the pressure chambers 34. When air bubbles are entrapped in the imprint material 8 in the pressure chambers 34, the air bubbles function as air dumpers in the ejection and the pressure fluctuation generated by the energy generation elements 29 in the pressure chambers 34 is attenuated. As a result, no imprint material 8 is ejected from the ejection ports 32 and the non-ejection occurs. The air bubbles are generated when a gas dissolved in the imprint material 8 in the pressure chambers 34 turns into air bubbles due to the pressure fluctuation in the ejection head or the like. Moreover, in some cases, menisci of the imprint material 8 largely vibrate in the ejection and air bubbles are taken into the imprint material 8. The air bubbles entrapped as described above cause the non-ejection.

There is a method of suppressing generation of air bubbles in which, upon filling the containing member 12 with the imprint material 8, the containing member 12 is filled with a degassed imprint material. However, a gas permeates resin members such as the containing member 12 over time and the imprint material 8 at the ejection ports 32 comes into contact with air. This causes the gas to dissolve into the imprint material and the amount of gas dissolved in the imprint material increases over time.

The containing member 12 is formed of the containing portion 15 in which the imprint material 8 is housed and the filling liquid portion 16 in which a filling liquid is housed. The filling liquid portion 16 is a space on the opposite side of the separation film 14 (flexible member) to the containing portion 15 and is a space not communicating with the ejection member 11. The filling liquid portion 16 communicates with the pressure control member 13 via a filling liquid pipe 17. In attaching and detaching of the ejection head 10, separation and connection can be achieved by using the coupling 56. The pressure control member 13 is formed of a filling liquid tank, a pipe, a pressure sensor, a pump, a valve, and the like. The pressure sensor, the pump, and the valve control the pressure of the filling liquid in the filling liquid portion. The pressure control member 13 controls the pressure of the filling liquid to control the pressure of the imprint material 8 in the containing portion 15 via the separation film 14.

Controlling the pressure of the imprint material 8 in a state where the imprint material 8 is isolated from the outside as described above can stabilize the shapes of gas-liquid interfaces (menisci) in the ejection member 11 and enables ejection of the imprint material 8 with good reproducibility. When the ejection of the imprint material 8 from the ejection member 11 is repeated, the imprint material 8 in the containing portion 15 is consumed and decreases and the separation film 14 deforms. The pressure control member 13 supplies the filling liquid to the filling liquid portion 16 with the deformation of the separation film 14 and fills the filling liquid portion 16 with the filling liquid.

Note that the containing portion 15 may be a portion obtained by forming a flexible film being a separation film in a bag shape like an IV bag. Moreover, the containing portion 15 may be configured such that a gas-liquid interface is provided in the containing portion 15. Furthermore, the containing portion 15 may be an atmosphere open type in which the containing portion 15 communicates with an atmosphere communication port. When the containing portion 15 is the atmosphere open type, a valve for switching between open and closed states (openable and closeable valve) and a device for controlling the pressure are preferably connected to the containing portion 15 to perform negative pressure control in a favorable manner.

In the field of an inkjet recording apparatus, ingenuities for maintaining the inside of the ejection member 11 within a certain negative pressure range have been made to stabilize the shapes of the menisci at the ejection ports of the ejection member 11. For example, there is known a method in which a porous body is formed in the containing portion to hold the imprint material and the negative pressure is generated by utilizing the capillary force in the porous body. Moreover, there are a method of generating the negative pressure in the containing portion by using a combination of a balloon-shaped film and a mechanical element such as a spring and a method of controlling the negative pressure by using a control valve and an air pressure. In the present invention, the negative pressure in the containing portion may be controlled by using any of these methods.

Figure 4:
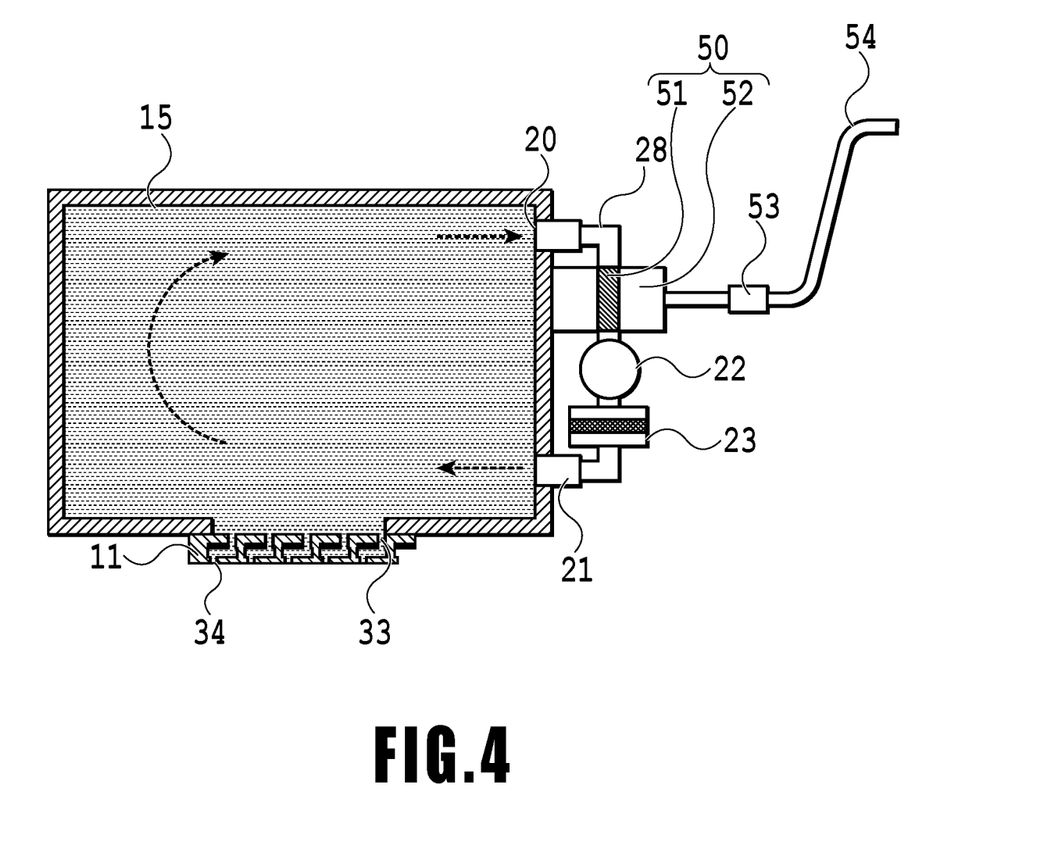
FIG. 4 is a cross-sectional view of the ejection head.

FIG. 4 is a cross-sectional view illustrating the ejection head 10 in the embodiment. The ejection head 10 in the embodiment includes a circulation mechanism which can cause the imprint material 8 inside the ejection head 10 to circulate in the containing portion 15. The containing portion 15 includes a first opening 20 and a second opening 21 and a passage forming member 28 connecting these two openings are arranged. The first opening 20 is an opening for supplying the imprint material 8 in the containing portion 15 into the passage forming member 28. The second opening 21 is an opening for returning the imprint material 8 supplied from the first opening 20 to the containing portion 15. The passage forming member 28 is a passage of the imprint material. A pump 22 and a degassing unit 50 are arranged in the passage forming member 28.

The degassing unit 50 includes a gas permeable film 51 and a cover 52 surrounding the gas permeable film 51. A pipe extends from the cover 52 and a coupling 53 is provided on the pipe. The members described above are configurations included in the ejection head 10. After the ejection head 10 is installed in the imprint apparatus 100, a discharge duct 54 is connected to the coupling 53 to reduce the pressure in the space inside the cover 52 to about −90 KPa.

Since the gas permeable film 51 is permeable only to gas and is not permeable to liquid, when the pressure in the cover 52 is reduced, the gas dissolved in the imprint material passes the gas permeable film 51 and escapes into the cover 52. The concentration of the gas dissolved in the imprint material thereby decreases. The imprint material with a lower concentration of the dissolved gas enters the containing portion 15 due to an operation of the pump 22. As a result, the amount of gas dissolved in the imprint material in the containing portion 15 decreases.

Since the containing portion 15 communicates with common liquid chambers 33 of the ejection member 11, a decrease in the amount of gas dissolved in the imprint material in the containing portion 15 can cause the amount of dissolved gas in the common liquid chambers 33 to decrease. When the amount of dissolved gas in the common liquid chambers 33 decreases, the dissolved gas in the pressure chambers 34 diffuses and the amount of gas dissolved in the imprint material in the pressure chambers 34 decreases.

Moreover, since the amount of the dissolved gas in the pressure chambers 34 has decreased, the air bubbles taken into the imprint material due to large vibration of the menisci in the ejection tend to dissolve into the imprint material. Accordingly, the air bubbles dissolve into the imprint material over time and eventually disappear. The gas dissolved into the imprint material is collected by the degassing unit 50. Suppressing the entrapment of air bubbles in the pressure chambers 34 as described above can suppress occurrence of non-ejection caused by the air bubbles in the imprint material.

Note that the concentration of the dissolved gas in the common liquid chambers 33 can be reduced by causing the degassed imprint material having passed the passage forming member 28 to flow to the common liquid chambers 33. Accordingly, the second opening 21 is preferably provided near the common liquid chambers 33, facing the common liquid chambers 33. In other words, it is preferable that the distance from the second opening 21 to the ejection member 11 is shorter than the distance from the first opening 20 to the ejection member 11.

The imprint material 8 used in the imprint apparatus 100 is required to contain as little foreign objects (fine particles) and metal ions as possible and to maintain its properties until application onto the substrate 4. In the present invention, the imprint material 8 is stored while being isolated from the outside of the containing portion 15 in a period in which the volume of the containing portion 15 decreases due to repeated ejection of the imprint material 8 and eventually all imprint material 8 is consumed.

In the attaching and detaching of the ejection head 10, it is only necessary to attach and detach the filling liquid pipe 17 and the discharge duct 54 of the degassing unit 50 and there is no need to attach and detach a flow passage on the imprint material side. Accordingly, the state where the imprint material is isolated from the outside can be maintained also in the attaching and detaching of the ejection head 10. As described above, in the embodiment, the imprint material does not come into contact with the outside air and devices such as the pressure sensor from the moment when the ejection head 10 is attached and detached to the moment when the imprint material is completely consumed. Accordingly, it is possible to suppress an increase of foreign objects and metal ions in the imprint material sealed in a managed state in an initial stage.

Note that the passage forming member 28 of the ejection head 10 may be provided with a filter 23. In some cases, the imprint material 8 turns into gel due to changes over time and the imprint material in the containing portion 15 needs to be filtered. Providing the filter 23 for filtering the imprint material in the passage forming member 28 allows the circulation pump 22 for degassing to be used also for circulation for filtering and cost and space can be reduced. Since there is a possibility of particles being generated in the pump 22, the filter 23 is preferably provided downstream of the pump 22 to catch the particles downstream of the pump 22.

Moreover, the imprint apparatus 100 is required to highly accurately control the amount and landing position of the imprint material ejected on the substrate. Accordingly, the shape of the meniscus at each ejection port 32 of the ejection member 11 needs to be stably maintained. In the ejection head 10, the pressure of the imprint material sometimes fluctuates due to drive of the pump 22. Accordingly, it is preferable to stop the drive of the pump 22 while the imprint material 8 is ejected from the ejection head 10.

Furthermore, in the imprinting step, the pattern is formed in each region of the substrate by repeating the ejection of the imprint material onto the substrate, the contact of the mold with the imprint material, the exposure, and the removal of the mold. Accordingly, it is preferable to perform degassing at a timing outside the period in which the imprint material 8 is ejected to the substrate. The timing of degassing may be a timing of substrate change or lot change.

Moreover, the degassing may be performed when abnormal ejection occurs and is detected. Furthermore, the degassing may be performed when the imprint apparatus is not operating. The degassing may be performed such that the pump 22 is stopped while the imprint step is performed and the degassing is performed during maintenance of the apparatus or in a time slot in which there is no substrate to be subjected to imprint processing. Moreover, the imprint apparatus or the ejection device may be configured to have a timer function and perform degassing when a certain time elapses. Furthermore, the degassing may be performed in response to a programmed command from the imprint apparatus or the ejection device.

As described above, the ejection head 10 is provided with the circulation mechanism including the degassing unit. The ejection device and the imprint apparatus capable of suppressing ejection failures and breakage of the mold can be thereby achieved.

Second Embodiment

The second embodiment of the present invention is described below with reference to the drawings. Note that, since the basic configurations of the embodiment are the same as those of the first embodiment, only the characteristic configurations are described below.

Figure 5:
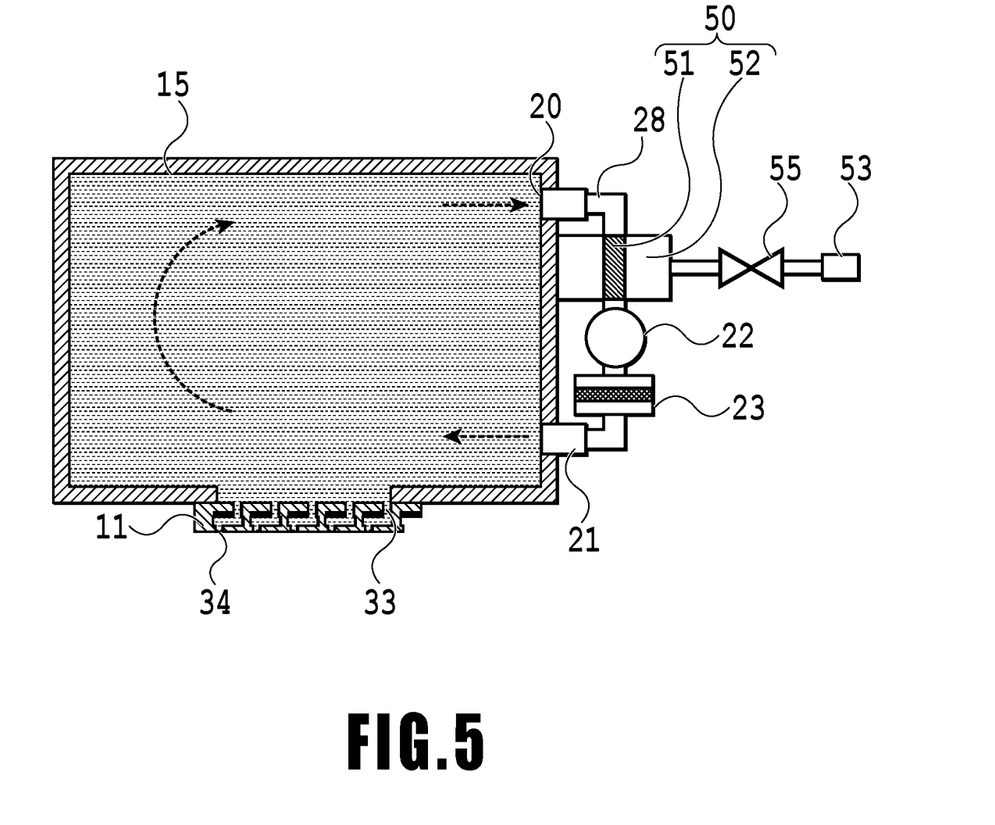
FIG. 5 is a cross-sectional view illustrating the ejection head.

FIG. 5 is a cross-sectional view illustrating the ejection head 10 in the embodiment. The ejection head 10 of the embodiment includes a valve 55 in a pipe extending from the cover 52 of the degassing unit 50. Providing the valve 55 as described above allows the inside of the cover 52 to be maintained in a reduced pressure state by closing the valve 55 after the discharge of the gas in the cover 52. Since the reduced pressure state can be maintained as described above, degassing can be performed for a certain period by operating the pump even in an environment without a discharge system as long as there is a power supply.

For example, when the ejection head 10 is to be transported or stored, the gas inside the cover 52 is discharged and the valve 55 is closed to maintain the space in the cover 52 in the reduced pressure state. Then, the degassing can be performed by connecting a battery to the pump 22 and causing the pump 22 to operate. When the ejection head 10 is to be connected to the imprint apparatus, it is only necessary to connect the discharge duct to the coupling 53 and discharge the gas via the valve 55.

Figure 6:
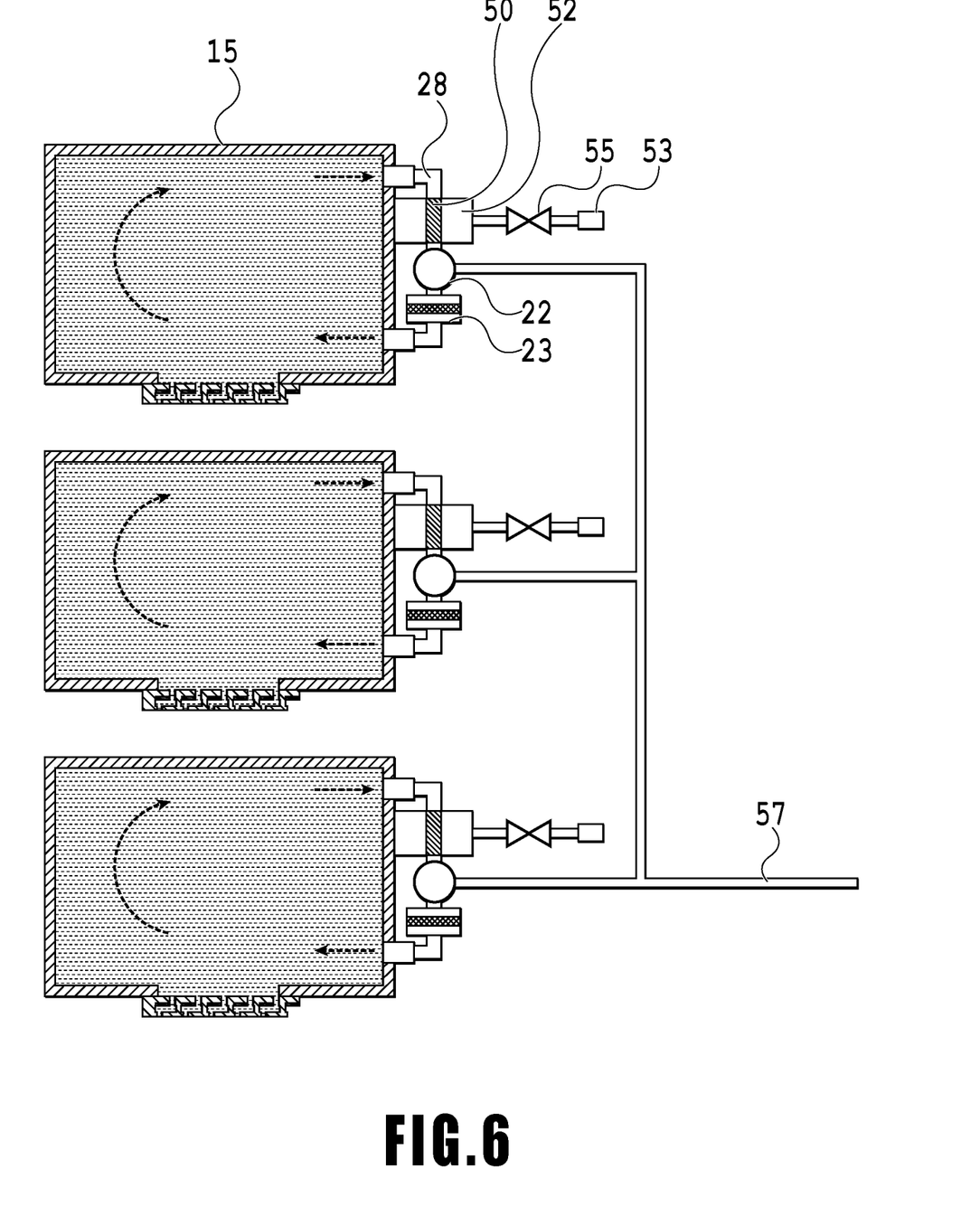
FIG. 6 is a view illustrating a state where ejection heads are connected in parallel to be stored.

FIG. 6 is a view illustrating a state where the ejection heads 10 of the embodiment are connected in parallel to be stored. When the ejection heads 10 are stored, as illustrated in FIG. 6, a degassed state of the multiple ejection heads 10 can be maintained by discharging the gas in the cover 52, closing the valve 55, and connecting power supply cables 57 to the multiple ejection heads 10 in parallel. The degassing state can be thereby maintained in the multiple ejection heads 10.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-003497 filed Jan. 12, 2018, which is hereby incorporated by reference wherein in its entirety.

What is claimed is:

1. An ejection device comprising:
an ejecting unit for ejecting an imprint material to which a pattern of a mold is transferred by bringing the mold into contact with the imprint material; and
a containing member including a first space containing the imprint material and a second space separated from the first space by a flexible member, the first space communicating with the ejecting unit,
wherein the containing member includes:
a first opening which directly communicates with the first space;
a second opening which directly communicates with the first space;
a connecting unit for allowing the imprint material to move between the first opening and the second opening;
a pump unit, provided in the connecting unit, for moving the imprint material between the first opening and the second opening; and
a degassing unit, provided in the connecting unit, for collecting gas dissolved in the imprint material,
wherein the imprint material from which the dissolved gas is collected by the degassing unit is ejected by the ejecting unit,
wherein the degassing unit is a unit that removes the gas dissolved in the imprint material by decompression,
wherein a pipe having a valve is connected to the degassing unit, and
wherein the degassing unit is capable of maintaining a reduced pressure state in the degassing unit by closing the valve.

2. The ejection device according to claim 1, wherein the connecting unit includes a filter unit capable of filtering out a foreign object contained in the imprint material.

3. The ejection device according to claim 2, wherein the pump unit moves the imprint material from the first opening to the second opening through the connecting unit, and the filter unit is provided downstream of the pump unit.

4. The ejection device according to claim 3, wherein a distance from the second opening to the ejecting unit is shorter than a distance from the first opening to the ejecting unit.

5. The ejection device according to claim 1, wherein the containing member is connected to a pressure control unit connected to the second space and capable of controlling a pressure in the second space.

6. The ejection device according to claim 5, wherein a pressure in the first space is controlled by controlling the pressure in the second space.

7. The ejection device according to claim 5, wherein the containing member and the pressure control unit are connected to each other by a coupling.

8. The ejection device according to claim 1, wherein the degassing unit is connected to a pressure reduction unit capable of reducing a pressure in the degassing unit via a coupling.

9. An imprint apparatus comprising:
an ejection device including ejecting unit for ejecting an imprint material on which a pattern is formed by bringing a mold into contact with the imprint material and a containing member including a first space containing the imprint material and a second space separated from the first space by a flexible member, the first space connected to the ejecting unit; and a processing device which brings the mold on which the pattern is formed into contact with the imprint material ejected from the ejecting unit, wherein the containing member includes:
- a first opening which directly communicates with the first space;
- a second opening which directly communicates with the first space;
- a connecting unit for allowing the imprint material to move between the first opening and the second opening;
- a pump unit, provided in the connecting unit, for allowing the imprint material to move between the first opening and the second opening; and
- a degassing unit, provided in the connecting unit, for collecting gas dissolved in the imprint material, wherein the imprint material from which the dissolved gas is collected by the degassing unit is ejected by the ejecting unit, wherein the degassing unit is a unit that removes the gas dissolved in the imprint material by decompression, wherein a pipe having a valve is connected to the degassing unit, and wherein the degassing unit is capable of maintaining a reduced pressure state in the degassing unit by closing the valve.

* * * * *